United States Patent
Paramythioti

(10) Patent No.: US 6,735,014 B2
(45) Date of Patent: May 11, 2004

(54) ABERRATION CORRECTING OPTICAL RELAY FOR OPTICAL SYSTEM, IN PARTICULAR MIRROR TELESCOPE

(76) Inventor: Michel Paramythioti, La Pêcherie, 41130 Gievres (FR)

( * ) Notice: Subject to any disclaimer, the term of this patent is extended or adjusted under 35 U.S.C. 154(b) by 0 days.

(21) Appl. No.: 10/220,406
(22) PCT Filed: Mar. 7, 2001
(86) PCT No.: PCT/FR01/00683
§ 371 (c)(1), (2), (4) Date: Aug. 30, 2002
(87) PCT Pub. No.: WO01/67153
PCT Pub. Date: Sep. 13, 2001

(65) Prior Publication Data
US 2003/0021024 A1 Jan. 30, 2003

(30) Foreign Application Priority Data
Mar. 7, 2000 (FR) .............................. 00 02911

(51) Int. Cl.⁷ .......................... G02B 13/06; G02B 27/14
(52) U.S. Cl. ...................... 359/434; 359/364; 359/366; 359/637
(58) Field of Search ................................. 359/358–366, 359/434–435, 637, 725–733, 762, 367, 431, 403–410, 480–482

(56) References Cited

U.S. PATENT DOCUMENTS

| 3,897,133 A | * | 7/1975 | Warner et al. | 359/365 |
| 4,086,000 A | * | 4/1978 | Cox et al. | 359/434 |
| 4,693,568 A |   | 9/1987 | Takahashi | 359/434 |
| 4,718,753 A |   | 1/1988 | Gebelein | 359/399 |
| 5,114,238 A | * | 5/1992 | Sigler | 359/399 |
| 5,644,436 A |   | 7/1997 | Togino et al. | 359/731 |
| 5,652,679 A | * | 7/1997 | Freeman | 359/731 |
| 5,764,407 A | * | 6/1998 | Nanba | 359/362 |
| 5,995,280 A |   | 11/1999 | Beach | 359/366 |
| 6,038,068 A |   | 3/2000 | Takeshi et al. | 359/399 |
| 6,118,583 A | * | 9/2000 | Rogers | 359/432 |

FOREIGN PATENT DOCUMENTS

| DE | 43 07 831 | 8/1993 |
| EP | 0 080 566 | 6/1983 |
| FR | 2 071 530 | 9/1981 |

* cited by examiner

Primary Examiner—Thong Q. Nguyen
(74) Attorney, Agent, or Firm—Schweitzer Cornman Gross & Bondell LLP

(57) ABSTRACT

An aberration-correcting optical relay for an optical system. The relay comprises front and rear converging optical units together with a correcting meniscus or two correcting meniscuses placed symmetrically relative to each other, the meniscus(es) having main faces that are substantially concentric, and preferably exactly concentric, the two converging optical units being placed on a common axis and the correcting meniscus(es) being placed on said axis between the two converging optical units. The front converging optical unit situated upstream from the correcting meniscus (es) is placed in such a manner that the distance from an image point of the portion of the optical system upstream from the optical relay to the front converging optical unit is equal to the focal length of the front converging optical unit, said unit thus transforming a beam coming from said image point into a parallel beam.

7 Claims, 4 Drawing Sheets

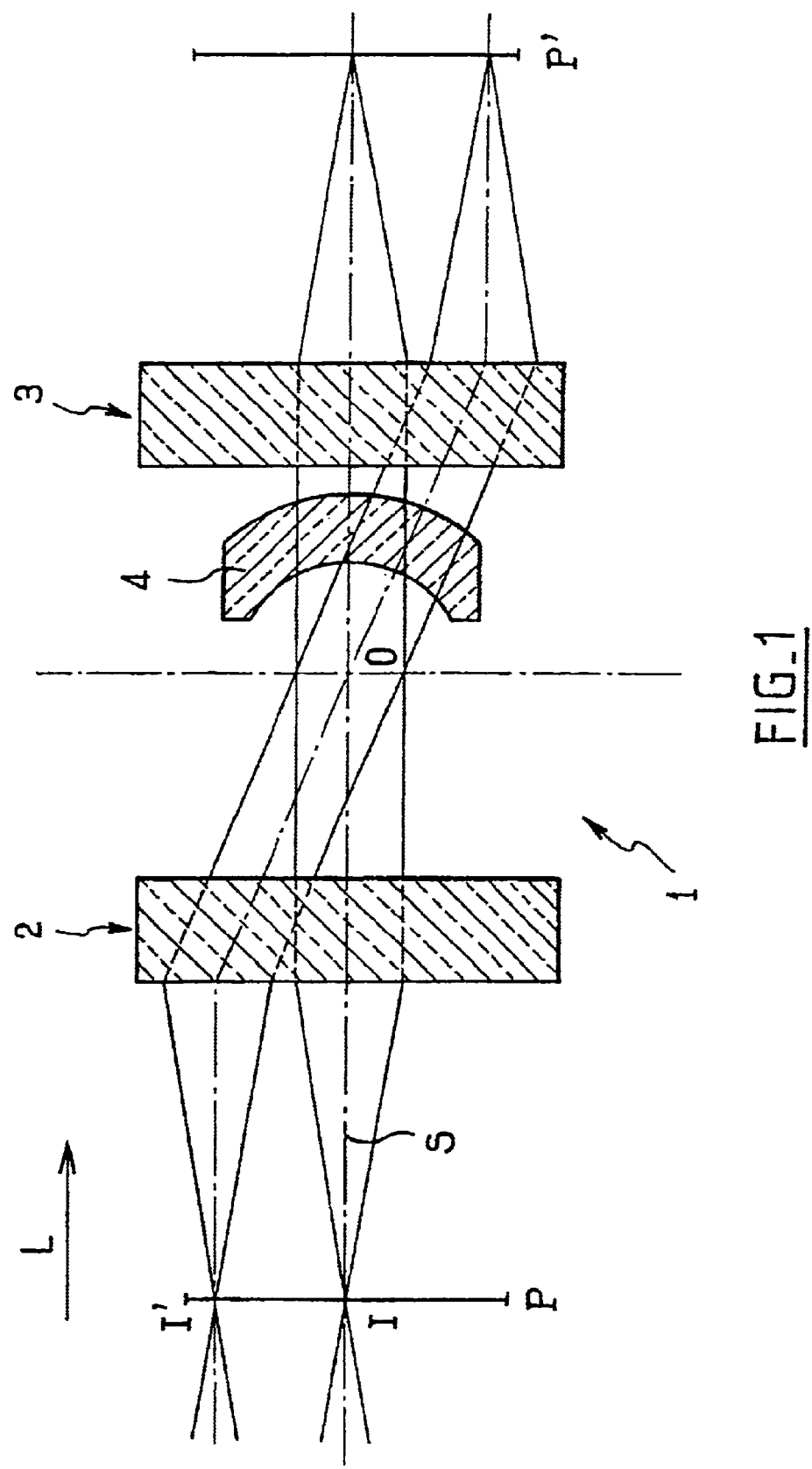
FIG_1

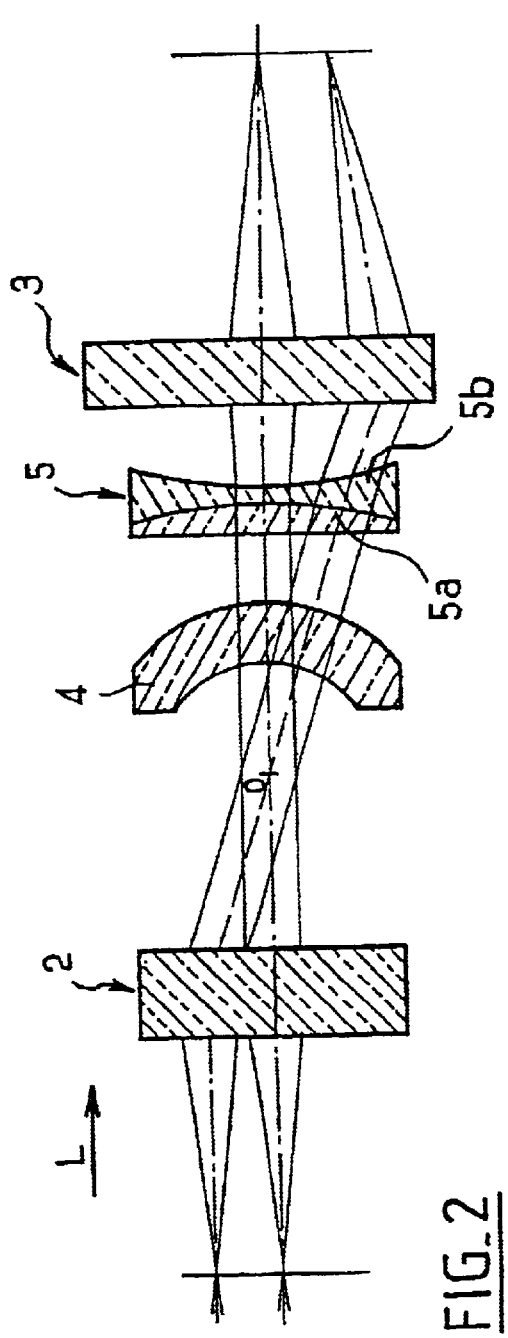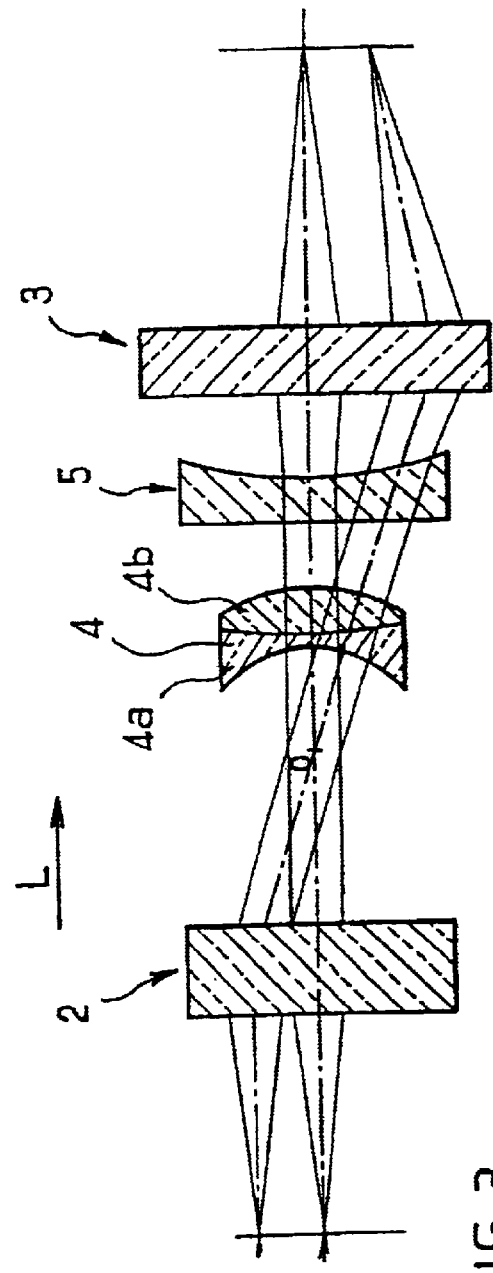

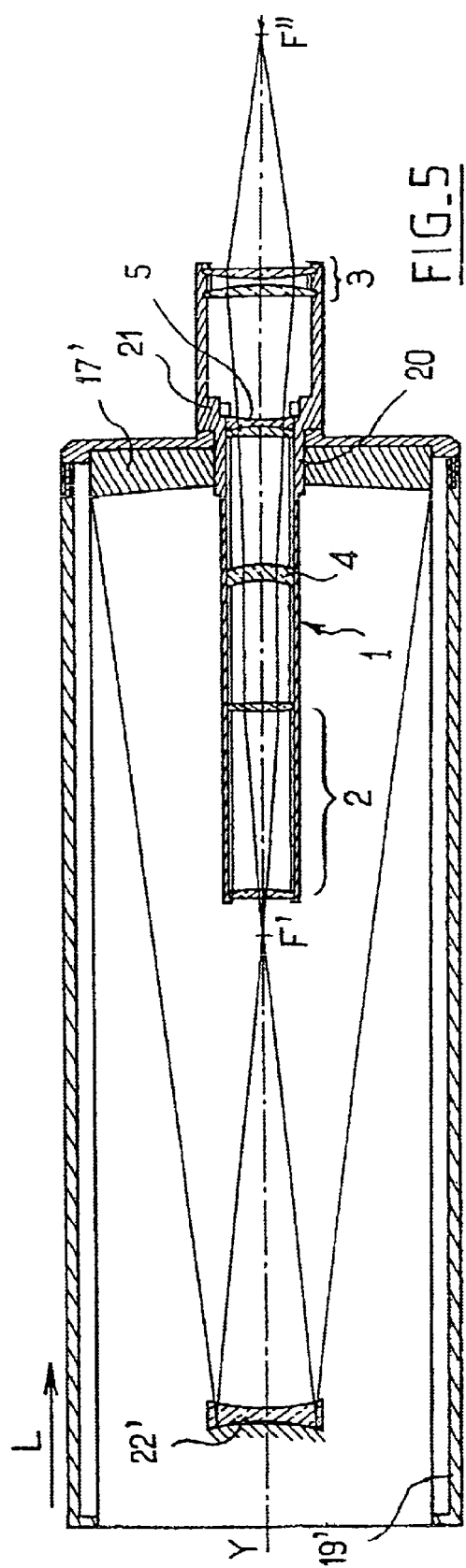
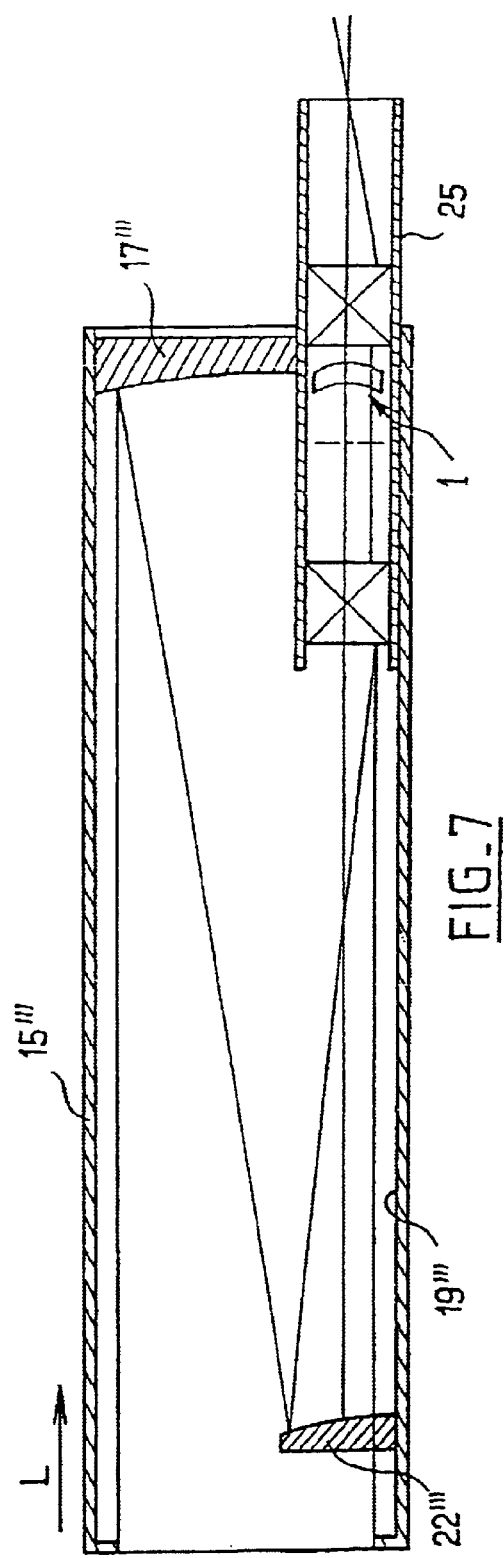

ABERRATION CORRECTING OPTICAL RELAY FOR OPTICAL SYSTEM, IN PARTICULAR MIRROR TELESCOPE

The present invention relates to an aberration-correcting optical relay for an optical system.

The invention relates more particularly, but not exclusively, to reflector telescopes.

BACKGROUND OF THE INVENTION

It is known that the various aberrations that arise in optical systems that include mirrors can be corrected by using mirrors of complex shape, e.g. of parabolic shape, and/or by including in a particular optical system full aperture corrector elements such as Schmidt blade or a Maksutov meniscus when the optical system is arranged as a reflector telescope.

Such correction means have the drawback of being complex to implement, and thus of giving rise to high costs.

OBJECTS AND SUMMARY OF THE INVENTION

The present invention seeks to correct aberrations of geometrical and/or chromatic type in an optical system in a manner that is simpler and less expensive.

When the optical system is arranged as a telescope having a primary mirror and a secondary mirror, the invention also makes it possible to reduce significantly the diameter of the secondary mirror.

The invention also makes it possible to transfer the image of the optical system from a position that is of difficult access or inaccessible to a position that is accessible for observation.

The invention achieves this by means of an aberration-correcting optical relay comprising two converging optical units, a front unit and a rear unit, and a correcting meniscus or two correcting meniscuses placed symmetrically relative to each other, the meniscus(es) having substantially concentric main faces, the two converging optical units being placed on the same axis and the correcting meniscus(es) being placed on said axis between the two converging optical units, the front converging optical unit situated upstream from the correcting meniscus(es) being placed in such a manner that the distance from an image point of the portion of the optical system upstream of the optical relay to the front converging optical unit is equal to the focal length of the front converging optical unit, said unit thus transforming a beam coming from said image point into a parallel beam.

When the image point is on the axis of the optical relay, the above-mentioned parallel beam strikes the meniscus parallel to the axis.

When the image point is off-axis, the above-mentioned parallel beam strikes the meniscus in a manner that is inclined relative to the axis.

The meniscus(es) are preferably provided with main faces that are exactly concentric.

The term "two correcting meniscuses placed symmetrically relative to each other" is used to mean two meniscuses that are placed in such a manner that their centers of curvature coincide.

The meniscus(es) can also be of small diameter and easy to make, thus enabling the optical relay to be advantageous in terms of cost.

By means of the invention, aberrations can be corrected solely at the aberration-correcting optical relay.

The invention thus makes it possible to eliminate the use of mirrors that are of complex shape and of full aperture corrector elements in the optical system.

At the outlet from the correcting meniscus, the beam becomes slightly divergent and it encounters the rear converging optical unit which is arranged to form an image at a location that is accessible for observation.

The optical elements constituting the optical relay preferably all have spherical faces.

Each of the converging optical units can comprise one or more lenses.

The correcting meniscus can be placed upstream or preferably downstream of the geometrical center of the optical relay, all parallel beams from the front optical unit converging on said geometrical center.

The center of curvature of the meniscus can coincide initially with the geometrical center of the optical relay, i.e. prior to subsequent adjustments.

By moving the center of curvature of the meniscus away from the geometrical center of the relay during adjustment, it is possible to correct off-axis aberrations since the above-mentioned inclined parallel beams are no longer centered on the meniscus, while the axial parallel beam remains unaffected.

It is thus possible to correct both coma and astigmatism to a very large extent without thereby affecting the initial axial adjustment of the optical elements of the relay.

A diverging lens can be placed in front of the rear converging optical unit, thus enabling various corrections to be improved on the axis and off-axis.

At least one of the optical elements of the relay, i.e. either the above-mentioned diverging lens or the meniscus or some other element of the optical relay is preferably formed by a doublet of two types of glass having substantially the same refractive index and Abbe numbers that are very different.

Thus, modifying the curvature of the internal face of the doublet makes it possible to correct chromatism to a very large extent without affecting the convergence of the doublet, and thus without affecting earlier geometrical adjustments.

In a particular embodiment, the optical system is arranged as a reflector telescope comprising a primary mirror and a secondary mirror, and having an aberration-correcting optical relay as defined above.

Under such circumstances, the optical relay is advantageously placed downstream from the assembly constituted by the primary and secondary mirrors such that an image point from said assembly coincides with the object point of the optical relay.

This makes it possible to provide overall correction of aberrations imparted by the primary and secondary mirrors.

The optical relay may have two lenses forming the front converging optical unit, one lens forming the meniscus, a diverging lens, and two lenses forming the rear converging optical unit, giving a total of six lenses.

The reflector telescope of the invention can be arranged in particular as a Newtonian type telescope comprising a primary mirror of spherical shape and a secondary mirror that is plane, i.e. mirrors that are of shapes that are simple and easy to make, while nevertheless making it possible to obtain images of good quality by virtue of the optical relay.

In a particular embodiment of a Newtonian type telescope of the invention, the diameter of the secondary mirror is much smaller than the diameter of the primary mirror.

The diameter of the secondary mirror is preferably about 10% to 15% the diameter of the primary mirror.

It is recalled that the diameter of the secondary mirror is about 25% of the diameter of the primary mirror in a conventional Newtonian type telescope.

Since the secondary mirror is placed on the path of the beam that is incident on the primary mirror, it is advantageous for the secondary mirror to be as small as possible so as to be collect a largest possible quantity of light and minimize the effect of diffraction induced by the edges of the secondary mirror.

The present invention thus causes the above drawbacks to disappear, at least in part, by using a secondary mirror that is much smaller in diameter than the primary mirror.

Such a reduction in the diameter of the secondary mirror is made possible by using the optical relay which enables the image from the secondary mirror to be transferred, which image can thus be formed close to the relay, at a location that is easier to access for observation.

In addition, because the image is transferred, it is possible to reduce the length of the central tube of the telescope.

Still in the context of a Newtonian type telescope, the optical relay preferably comprises a meniscus formed by a doublet of two types of glass as described above together with a diverging lens formed by a single type of glass placed in front of the rear converging optical unit.

In another particular embodiment, the reflector telescope of the invention is arranged as a Cassegrain type telescope and has a primary mirror of spherical shape and a secondary mirror that is also of spherical shape.

In a particular embodiment of the Cassegrain type telescope, the secondary mirror is much smaller in diameter than the primary mirror.

The diameter of the secondary mirror is preferably about 20% to 25% the diameter of the primary mirror.

It is recalled that the diameter of the secondary mirror is about 35% to 45% the diameter of the primary mirror with a conventional Cassegrain type telescope.

This reduction in the diameter of the secondary mirror is made possible by using the optical relay which makes it possible to bring the image formed by the secondary mirror much closer to the secondary mirror.

The other advantages mentioned above for a Newtonian type telescope are also observed with a Cassegrain type telescope.

With a Cassegrain type telescope, the optical relay preferably has a meniscus formed by a single type of glass and a diverging lens formed by a doublet of two types of glass having the same refractive index and Abbe numbers that are very different.

The secondary mirror of the Cassegrain type telescope of the invention is advantageously a Mangin type mirror, i.e. reflection takes place on the rear face of a diverging lens constituting the Mangin mirror.

This achieves almost perfect correction of spherical aberration.

In another particular embodiment, the reflector telescope of the invention is arranged as a Newtonian type telescope having a primary mirror of spherical shape oriented in such a manner as to direct the converging light beam towards a point that is situated close to the inside wall of the telescope where the secondary mirror is located.

Because of its offset position, close to the inside wall of the telescope, the secondary mirror constitutes no more than a minimal obstruction for the incident beam on the primary mirror.

In this particular embodiment, the secondary mirror is advantageously fixed to the inside wall of the telescope by a single fixing means.

This eliminates the diffraction effect imparted by the fixing for the secondary mirror.

Still in this particular embodiment, the optical relay may be inclined relative to the side wall of the telescope.

This enables the volume of the telescope to be reduced.

In a particular embodiment of a Cassegrain type telescope of the invention, the spherical primary mirror is oriented in such a manner as to direct the converging light beam towards a point situated close to the inside wall of the telescope where the secondary mirror is located.

Thus, because of its offset position, close to the inside wall of the telescope, the secondary mirror constitutes no more than a minimal obstruction for the light beam incident on the primary mirror.

Advantageously, the secondary mirror is fixed to the inside wall of the telescope by a single fixing means, thus eliminating the diffraction effect induced by the fixing of the secondary mirror.

The invention thus makes it possible to provide an optical system that is arranged as a binocular telescope by associating two Cassegrain type telescopes in the particular configuration described immediately above, each telescope having an eyepiece and both telescopes being disposed in parallel, the eyepieces being spaced apart from each other by a distance that corresponds to the spacing between the eyes of a user.

BRIEF DESCRIPTION OF THE DRAWINGS

Other characteristics and advantages of the present invention appear on reading the following detailed description of non-limiting embodiments of the invention and from the accompanying drawings, in which:

FIG. 1 is a highly diagrammatic view of an aberration-correcting optical relay of the invention;

FIGS. 2 and 3 are diagrams showing the optical elements making up the FIG. 1 optical relay in first embodiments of the invention;

FIG. 5 is a diagrammatic view in axial section of a Cassegrain type telescope fitted with an aberration-correcting optical relay of the invention;

FIG. 7 is a diagrammatic axial section view of a Cassegrain type telescope fitted with an aberration-correcting optical relay constituting a variant embodiment of the invention.

MORE DETAILED DESCRIPTION

Figures 4, 6:
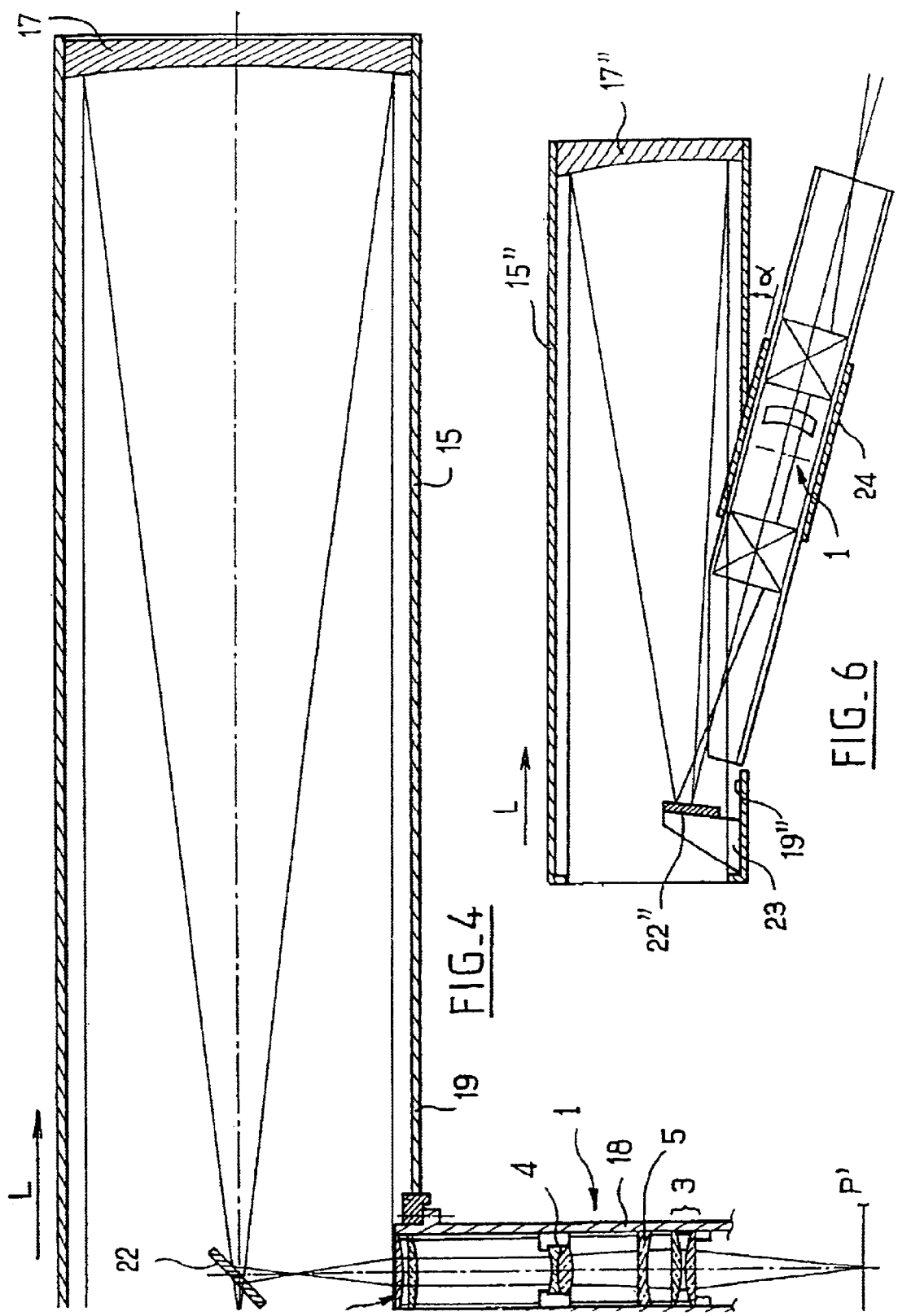
FIG. 4 is a diagrammatic axial section view of a Newtonian type telescope fitted with an aberration-correcting optical relay of the invention.
FIG. 6 is a diagrammatic view in axial section of a Newtonian type telescope fitted with an aberration-correcting optical relay constituting a variant embodiment of the invention.

FIG. 1 is a highly diagrammatic representation of an aberration-correcting optical relay 1 of the invention for fitting to an optical system, not shown.

The light propagation direction is represented by arrow L.

The optical relay 1 comprises a front converging optical unit 2, a rear converging optical unit 3, and a correcting meniscus having concentric main faces 4 and that lies on the axis of symmetry S of the optical relay 1.

The front converging optical unit 2 is placed within the optical system in such a manner that the distance from an image point I or I' in the plane P as formed by the portion of the optical system upstream from the optical relay 1 to the front converging optical unit 2 is equal to the focal length of said front unit 2.

This unit therefore converts an incident beam coming from the image point I or I' into a parallel beam.

This beam is parallel to the axis S if the image point I is on the axis S and it is inclined relative to the axis S if the image point I' is off-axis.

The geometrical center of the optical relay 1 where all parallel beams converge is represented in the drawing by point O.

The correcting meniscus 4 is placed downstream from the geometrical center O and is initially positioned in such a manner that the center of curvature of the meniscus coincides with the center O.

Thus, in this configuration, the parallel beams coming from the front unit 2 are centered on the faces of the meniscus 4.

The optical relay 1 serves to transfer the image formed in the plane P which is difficult to access for observation to an observation plane P' situated at a location that is easy to access for observation and where an eyepiece is placed for observing the image.

The eyepiece can be replaced by a photographic plate or by a CCD type device.

As shown in FIG. 2, in front of the rear converging optical unit 3 it is possible to place a diverging lens 5 whose function is explained below.

The diverging lens 5 is constituted by a doublet of two types of glass 5a and 5b having refractive indices that are identical and Abbe numbers that are very different.

In the example described, the meniscus 4 is made of a single glass.

In a variant as shown in FIG. 3, the diverging lens 5 is constituted by a single type of glass and the correcting meniscus 4 is constituted by a doublet of two types of glass 4a and 4b having identical refractive indices and Abbe numbers that are very different.

In general, at least one of the optical elements constituting the optical relay 1 is constituted by such a doublet.

The various steps in the procedure for adjusting the parameters of the various elements of the optical relay 1 in order to minimize aberration are described below.

This procedure needs to be implemented on appropriate optical simulation software.

Preferably, it does not make use of formal calculation which would be exceedingly complex for such adjustment, but consists in interactive adjustments relying on a succession of adjustments that the operator refines iteratively.

1) The first step consists in monochromatic correction on the axis.

This consists in using monochromatic light coming from an image point I on the axis formed by the portion of the optical system that is upstream from the optical relay 1 to dimension the correcting meniscus 4 by acting on its radius of curvature and its thickness in order to improve correction of spherical aberration.

This adjustment is performed using monochromatic light at a wavelength that is in the middle of the wavelength range of use, for example.

2) The second step consists in monochromatic correction off-axis, in particular concerning coma and astigmatism.

The idea here is to use monochromatic light from an image point I' off the axis formed using the optical system upstream from the optical relay 1 to obtain best correction by moving the correcting meniscus 4 along the axis away from its initial position centered on the geometrical center O, e.g. towards the front unit 2.

3) The third step consists in correcting chromatic aberration.

To do this, action is taken on the curvature of the internal face of the doublet(s) placed in the optical relay.

Since the Abbe numbers of the two types of glass forming the doublet(s) are very different, the curvature of the internal face of the doublet(s) acts on the chromatism of the optical system without affecting the convergence of the system, since the refractive indices of the types of glass are identical.

This makes it possible for the corrections of geometrical and chromatic aberrations to be independent.

The adjustment in step 3) therefore does not affect the results acquired steps 1) and 2).

Between steps 2) and 3), it is possible to add a step 2') consisting in finding the best distance between the diverging lens 5 and the rear unit 3 and acting on the characteristics of the diverging lens 5 so as to optimize off-axis adjustments in particular.

The adjustment in step 2') affects the results obtained during steps 1) and 2).

Thus, where necessary, the preceding adjustments are repeated prior to moving on to perform the adjustment of step 2') again.

These adjustments are reiterated in succession until the best overall correction is obtained.

There follows a description of various optical systems fitted with the optical relay 1.

FIG. 4 shows a Newtonian type telescope fitted with an aberration-correcting optical relay 1.

The telescope is constituted by a main cylinder 15 that is open at one end so as to form the pupil 16 of the telescope.

The spherical mirror 17 forming the primary mirror of the telescope is placed at the other end of the cylinder 15.

A plane mirror 22 forming the secondary mirror of the telescope is placed so as to be inclined relative to the axis of symmetry X of the cylinder 15 so as to send the beams coming from the primary mirror 17 towards the aberration-correcting optical relay 1 which is mounted in a secondary cylinder 18 perpendicular to the main cylinder 15 and in which there is also housed the eyepiece of the telescope (not shown).

The image made by the telescope forms in the observation plane P' where the eyepiece is placed in order to observe it.

The eyepiece can be replaced by a photographic plate or by a CCD type device.

In the example described, each of the front and rear converging units 2 and 3 is constituted by a pair of lenses, and the meniscus 4 is formed by a doublet as described above.

A diverging lens 5 made of a single type of glass is placed between the meniscus 4 and the rear unit 3.

FIG. 5 shows a Cassegrain type telescope fitted with an aberration-correcting optical relay 1.

The primary mirror 17' of the telescope is constituted by a spherical mirror having an opening 20 formed in the center thereof.

The opening 20 serves to receive a cylinder 21 of small diameter in which the optical relay 1 and an eyepiece (not shown) are located.

The secondary mirror is constituted by a spherical mirror 22' placed on the axis Y of the telescope.

The incident beam centered on the axis Y converges substantially towards a point F', constituting the image point for the assembly made up of the primary and secondary mirrors 17' and 22', which point is situated in front of the optical relay 1 which serves in turn to transfer the image from the point F' to a point F" where it is accessible for observation.

An additional converging lens may be placed in the vicinity of F' in order to further reduce the incident beam towards the cylinder 21 so that its diameter becomes even smaller.

In the example described, the secondary mirror 22' is a Mangin type mirror serving significantly to improve correction of spherical aberration.

In the example described, the front and rear optical units 2 and 3 are constituted by pairs of lenses while the meniscus 4 is constituted by a single type of glass.

The diverging lens 5 constituted by a doublet of the kind described above is placed behind the meniscus 4, in front of the rear unit 3.

FIG. 6 shows a Newtonian type telescope in which the plane secondary mirror 22" is located close to the inside wall 19" of the cylinder 15" of the telescope.

The spherical primary mirror 17" of the telescope is oriented in such a manner as to direct the incident light beam towards the secondary mirror 22".

The mirror 17" constitutes a portion of a large virtual spherical mirror centered on the optical relay 1.

The secondary mirror 22" is fixed to the inside wall 19" of the telescope by single fixing means 23.

In this offset position close to the inside wall 19", the secondary mirror 22" constitutes a small obstruction only for the incident beam on the primary mirror 17".

The cylinder 24 housing the optical relay 1 and the eyepiece is inclined at an angle α of 15° relative to the cylinder 15" of the telescope in the example shown.

FIG. 7 shows a Cassegrain type telescope comprising a spherical primary mirror 17''' oriented so as to direct the converging light beam towards a point situated close to the inside wall 19''' of the cylinder 15''' of the telescope where the spherical secondary mirror 22''' is placed.

The mirror 17''' constitutes a portion of a virtual large spherical mirror centered on the optical relay 1.

The secondary mirror 22''' is fixed to the inside wall 19''' by single fixing means (not shown).

In this embodiment of the invention, the cylinder 25 in which the aberration-correcting optical relay 1 and an eyepiece are mounted is placed against the inside wall 19''' of the telescope.

It will be understood that by associating two telescopes of the type shown in FIG. 7 makes it possible to implement a binocular type telescope, where both telescopes are placed parallel to each other with the cylinders 25 being spaced apart from each other by a distance corresponding to the spacing between the eyes of a user (60 millimeters (mm) to 65 mm).

This association is made possible in particular by the fact that the optical relay 1 rectifies the images.

Naturally, the invention is not limited to the embodiments described above.

The aberration-correcting optical relay can in particular be used in other optical systems, such as a periscope or a laser optical system or a projection system, for example.

The aberration-correcting optical relay can naturally be used for any optical system requiring one or more optical relays.

What is claimed is:

1. An aberration-correcting optical relay for an optical system, the relay having an axis and comprising:

two converging optical units, a front unit and a rear unit, placed on said axis and each having a focal length;

at least one correcting meniscus having substantially concentric main faces the correcting meniscus being placed on said axis between the two converging optical units; and a diverging lens placed between the meniscus and the rear converging optical unit on said axis;

wherein the front converging optical unit is situated upstream from the correcting meniscus and is placed in such a manner that the distance from an object point to the front converging optical unit is equal to the focal length of the front converging optical unit, such as to transform a beam coming from said object point into a parallel beam, and wherein at least one of the diverging lens and the meniscus is formed by a doublet of two types of glass having the same refractive index and very different Abbe numbers.

2. An optical system configured as a telescope having a primary mirror and a secondary mirror, comprising an aberration-correcting optical relay according to claim 1 placed downstream of the primary and secondary mirrors, an image from the mirrors being en object for the optical relay.

3. An optical system according to claim 2, configured as a Newtonian type telescope having a spherical primary mirror and a plane secondary mirror.

4. An optical system according to claim 2, configured as a Cassegrain type telescope having spherical primary and secondary mirrors.

5. An optical system according to claim 4, wherein the secondary mirror is a Mangin type mirror, reflection taking place on the rear face of a diverging lens constituting the Mangin mirror.

6. An interactive method for adjusting the parameters of elements of the optical relay according to claim 1, said method using optical simulation software, said method comprising:

adjusting the radius of curvature and the thickness of the meniscus using monochromatic light so as to improve correction of spherical aberration;

adjusting the position of the meniscus along the axis using a monochromatic light so as to improve correction of coma and astigmatism; and adjusting the curvature of the internal face of the doublet placed in the optical relay so as to improve chromatic correction.

7. A method according to claim 6, further comprising the step of adjusting the distance between the diverging lens and the rear unit so as to improve off-axis chromatic correction.

* * * * *